United States Patent [19]

Amelio et al.

[11] 3,955,101
[45] May 4, 1976

[54] DYNAMIC REFERENCE VOLTAGE GENERATOR

[75] Inventors: Gilbert F. Amelio, Saratoga; James M. Early, Palo Alto, both of Calif.

[73] Assignee: Fairchild Camera and Instrument Coporation, Mountain View, Calif.

[22] Filed: July 29, 1974

[21] Appl. No.: 492,649

[52] U.S. Cl. ................. 307/235 H; 307/221 D; 307/235 J; 307/235 K; 307/279; 307/DIG. 3
[51] Int. Cl.² ................ H03K 5/20; G11C 19/28; H03K 5/18; H03K 3/353
[58] Field of Search .......... 307/221 C, 221 D, 235, 307/238, 279; 340/173 CA, 173 FF

[56] References Cited
UNITED STATES PATENTS

| | | | |
|---|---|---|---|
| 3,351,837 | 11/1967 | Owen | 340/173 CA |
| 3,737,790 | 6/1973 | Brown | 307/235 |
| 3,758,794 | 9/1973 | Kosonocky | 307/221 C X |
| 3,824,413 | 7/1974 | Awipi et al. | 307/221 D X |
| 3,838,295 | 9/1974 | Lindell | 307/238 |
| 3,852,801 | 12/1974 | Itoh et al. | 307/221 D X |

OTHER PUBLICATIONS

Chai et al., "Noise Compensator for Charge–Coupled Devices"; *IBM Tech. Discl. Bull.*; Vol. 16, No. 4, pp. 1099–1100; 9/1973.

*Primary Examiner*—Stanley D. Miller, Jr.
*Assistant Examiner*—Larry N. Anagnos
*Attorney, Agent, or Firm*—Alan H. MacPherson; Henry K. Woodward; J. Ronald Richbourg

[57] ABSTRACT

A reference voltage generator for generating reference voltages for use in charge-coupled devices includes a means for generating a charge whose magnitude lies between a first charge representing a number in an *n*-dimensional logic system and a second charge representing another number in an *n*-dimensional logic system, comparison means electrically coupled to the means for generating a charge, the comparison means generating a voltage representative of the charge and comparing the voltage with an instantaneous reference voltage to provide an indication of the relative magnitudes of the voltage and the instantaneous reference voltage, and feedback means electrically coupled to the comparison means for producing an instantaneous reference voltage and including a means for providing an incremental adjustment to the instantaneous reference voltage in response to the indication of relative magnitude, the incremental adjustment serving to bring the value of the instantaneous reference voltage closer to the value for the voltage.

9 Claims, 9 Drawing Figures

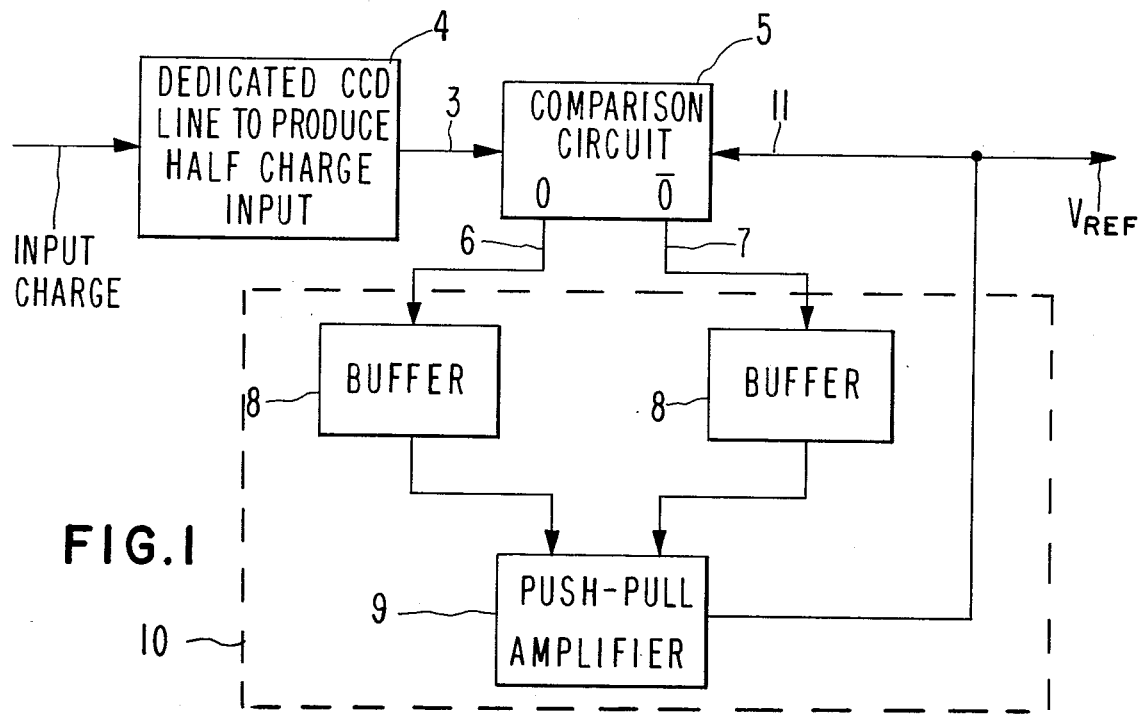
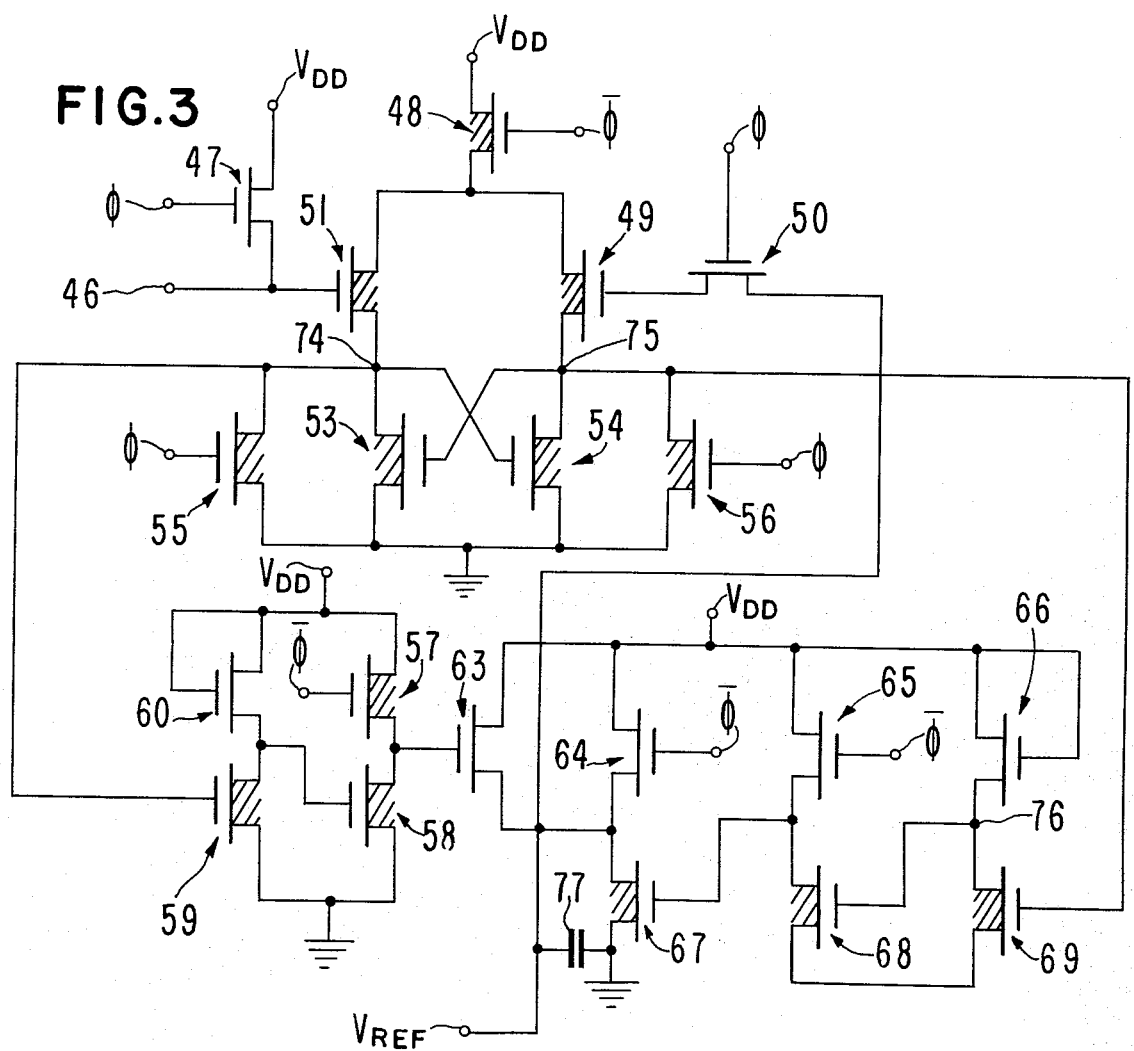

DYNAMIC REFERENCE VOLTAGE GENERATOR

This invention relates to a means for generating a reference voltage and, more particularly, to a means for generating a reference voltage for use in a comparison circuit which detects the magnitude of charge in a charge-coupled device.

The operation of data-processing circuits such as charge-coupled devices generally requires that reference voltages be generated. These reference voltages may have fixed values or may be variable. When these circuits are fabricated in integrated-circuit form, the reference voltages typically are generated by means which are fabricated in the same semiconductor substrate using at least some of the same process steps as are the components of the data-processing circuits. In order to allow for variations in the values for a particular reference voltage which result from process variations it is necessary to design the data-processing circuits to function over the ranges of possible reference voltages. This does not necessarily produce devices of minimum size geometry.

In a comparison circuit employing a latch for use in a charge-coupled device, it is required that a reference voltage be available which lies between the possible voltages associated with the magnitude of a charge being compared. In a digital charge-coupled device the reference voltage should lie between the voltage associated with a minimum value "1" and a maximum value "0". The breadth of the ranges of possible values for the voltages associated with the charge to be compared (conventionally a greater voltage signifies a digital "1" and a lesser or nominal voltage signifies a digital "0") is determined by the precision with which devices are designed, the resolution achievable with existing fabrication techniques, and the care with which processing is carried out. A comparison between a voltage associated with a charge and the reference voltage can be carried out only if the range of possible reference voltages lies between and does not overlap the ranges of possible voltages associated with the charge being compared, since any overlap could lead to erroneous results. It would thus be highly desirable to be able to generate a reference voltage which automatically lies approximately midway between the possible worst case voltages (minimum "1" and maximum "0") associated with the charge being compared. The absence of a range of reference voltages would allow components of smaller dimensions to be used in the comparison circuit and would also allow smaller CCD charge storage elements.

SUMMARY OF THE INVENTION

A reference voltage generator is provided for generating reference voltages for latch-type circuits typical of those used in charge-coupled devices and semiconductor memories. The reference voltage generator includes a means for generating a charge whose magnitude lies between a first charge representing a number in an $n$-dimensional logic system and a second charge representing another number in an $n$-dimensional logic system, comparison means electrically coupled to the means for generating a charge, the comparison means generating a voltage representative of the charge and comparing the voltage with an instantaneous reference voltage to provide an indication of the relative magnitudes of the voltage and the instantaneous reference voltage, and a feedback means electrically coupled to the comparison means for producing an instantaneous reference voltage and including a means for providing an incremental adjustment to the instantaneous reference voltage in response to the indication of relative magnitude, the incremental adjustment serving to bring the value of the instantaneous reference voltage closer to the value for the voltage.

BRIEF DESCRIPTION OF THE DRAWINGS

For a more complete understanding of the present invention, reference may be had to the accompanying figures which are incorporated herein by reference and in which:

FIG. 1 is a block diagram illustrating the functional elements of the reference voltage generator of the present invention;

FIG. 3 is a logic diagram of another embodiment of the reference voltage generator;

DESCRIPTION OF THE PREFERRED EMBODIMENTS

Figure 2:
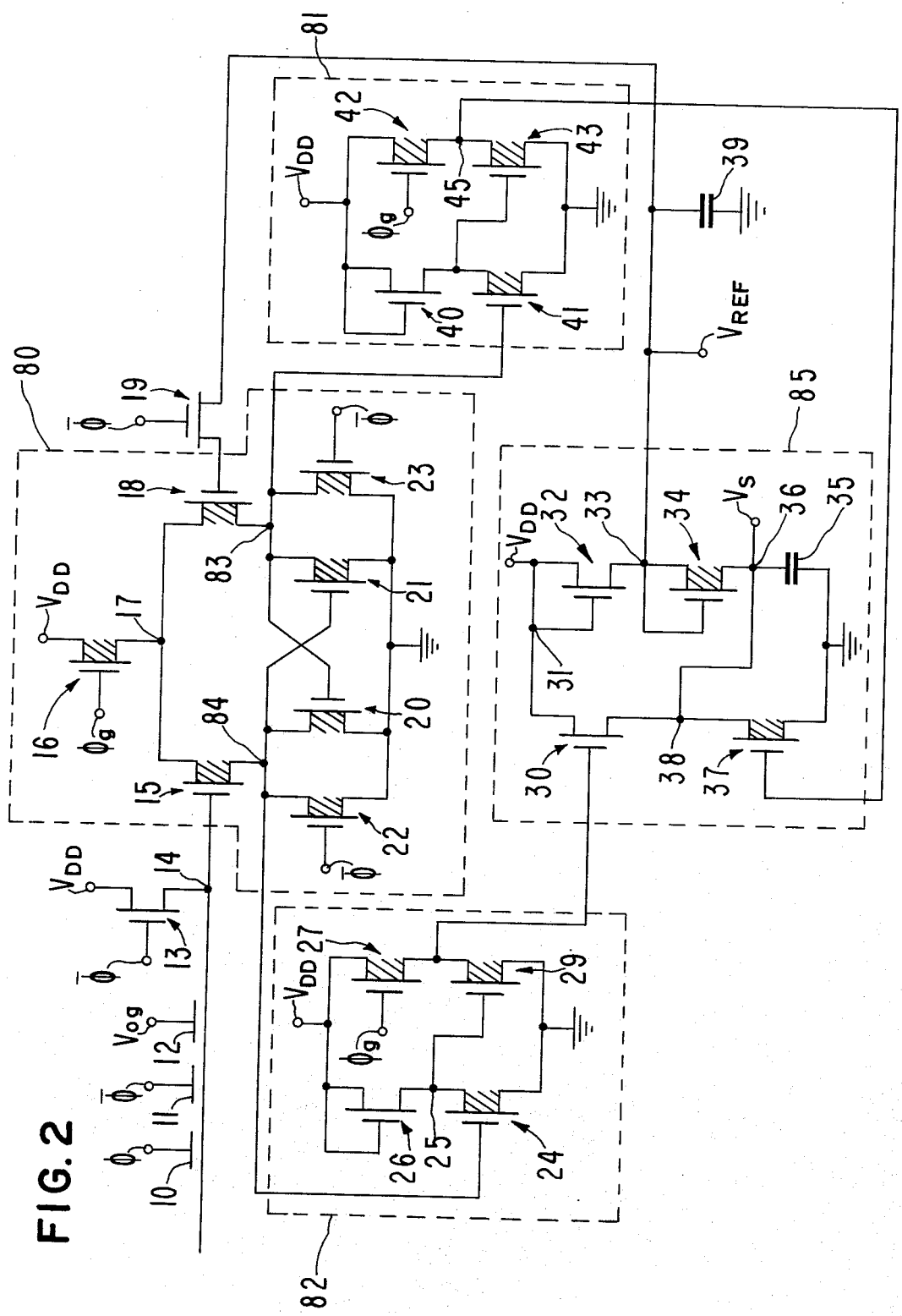
FIG. 2 is a logic diagram illustrating a particular embodiment of the reference voltage generator.

A primary goal in the design and fabrication of integrated-circuit devices is reduction of chip size for a circuit that performs a given function. The present invention facilitates this reduction in circuits which utilize comparison subcircuits by providing a reference voltage which dynamically tracks the magnitude of the signal to be compared. This invention is especially useful in comparison circuits employing "flip-flop" arrangements which detect the magnitude of charge in a charge-coupled device by comparing a voltage associated with the charge with a reference voltage. Such comparison circuits require a reference voltage which has a value lying approximately midway between possible values for a voltage associated with the charge. In a digital charge-coupled device there will be two possible charges, one representing a digital "1" and the other representing a digital "0". In tertiary or higher order $n$-dimensional schemes there will be multiple possible charges and cummulative comparison steps will be necessary. In a digital charge-coupled device the reference voltage generated by the voltage generation means of the present invention will dynamically adjust itself to an approximate mid-position between the voltages associated with the possible input charges such as a charge packet representing a digital "1" on the one hand with a magnitude greater than a fixed amount, e.g., greater than 0.15 picocoulomb, or a charge packet representing a digital "0" on the other hand and having a magnitude less than a fixed amount, e.g., less than 0.05 picocoulomb. Replacement of the wide range of reference voltages normally caused by process variations by the much narrower range of reference voltages resulting from a dynamically tracking reference voltage generator permits smaller geometry charge storage elements to be used in the charge-coupled device.

The reference voltage generator of the present invention essentially operates on the principle of sampling the quantity to be compared at each clock cycle and of generating a voltage associated with the quantity. The voltage associated with each sample is compared with an instantaneous reference voltage which is produced by a feedback loop which has adjusted the value of the instantaneous reference voltage to reflect the information derived from all previous sampling. In a charge-coupled device, samples of charge are obtained from a dedicated line of charge storage elements (CCD line) which receives input charge of equivalent magnitude to full charge packets introduced to data-processing portions of the device. As stated above, for a digital charge-coupled device, data is transmitted in the data-processing portion of the device in the form of full charge packets or nominal charge packets. If a reference voltage is sought for use in a comparison circuit employing flip-flops (see copending U.S. application Ser. No. 448,771 by Gunsagar and Amelio), the reference voltage should lie approximately midway between voltages associated with a full charge packet and a nominal charge packet, i.e., should be about the value of a voltage associated with one-half the charge in a full charge packet. Thus, the dedicated CCD line is designed to divide the full charge packet input into a one-half charge packet sample. The reference voltage generator, then, produces a voltage associated with each half charge packet sample, compares this voltage with an instantaneous reference voltage and through a feedback loop incrementally adjusts the value of the instantaneous reference voltage to make it closer to the voltage associated with the half charge packet sample. The comparator circuit used here and described in detail subsequently should be as nearly as possible identical to the comparator circuits for which the reference voltage is generated so as to minimize any mismatching over the range of operation. Once the instantaneous reference voltage is close to the voltage associated with the sample, it may be employed externally as the desired reference voltage.

The overall function of the reference voltage generator of the present invention may be seen by reference to FIG. 1. An input charge equal to the input charge introduced to a standard line of CCD cells is introduced to a dedicated line 4. This dedicated line, as described above, splits the charge to approximately one-half the magnitude of a full charge packet. The output of the dedicated CCD line 4 is introduced at input 3 of a comparison circuit 5. The other input 11 of comparison circuit 5 is connected to the instantaneous reference voltage value taken from the output of push-pull amplifier 9. It is this instantaneous value for the reference voltage which serves as the reference voltage for the charge comparison circuits in the charge-coupled device, i.e., it is this value which serves as the output of the reference voltage generator.

Comparison circuit 5 performs a comparison between a voltage associated with the incoming half-magnitude charge and the instantaneous reference voltage. If the voltage associated with the incoming charge is greater than the instantaneous value for the reference voltage, then a voltage will appear on the output line 6. If the voltage associated with the incoming charge is less than the instantaneous value for the reference voltage, then a voltage will appear on the inverse output line 7. Only one of the two lines 6 or 7 will receive a voltage. In either case, this voltage is transmitted through a buffer circuit 8 in feedback loop 10 so that no load is placed on comparison circuit 5. The buffer circuits 8 drive the respective inputs of push-pull amplifier 9. If a voltage is present on output line 6, then the push-pull amplifier 9 will push the instantaneous value of the reference voltage up so that the externally accessible reference voltage is increased as well as the voltage fed back to input 11 of comparison circuit 5. The feedback from feedback loop 10 to comparison circuit 5 is fast enough so that the increased voltage on terminal 11 will be established before another half charge is received by input 3. The process will be repeated and, assuming the voltages associated with the continuing succession of incoming half-magnitude charges are still less than the instantaneous value for the reference voltage, the voltage on terminal 11 will be icnreased in stepwise fashion until it reaches a level at which it is greater than the voltage associated with the incoming charge. At that point a voltage is presented to output line 7 and push-pull amplifier 9 pulls the voltage of terminal 11 down. From this point on, the instantaneous value of the reference voltage will remain relatively constant as its absolute magnitude is slightly increased or decreased as it is found to be below or above the voltage associated with the incoming charge. The resultant voltage will essentially be a direct current voltage with a slight and continuing ripple as it hunts for the "true" voltage. In effect, push-pull amplifier 9 provides a positive means of forcing the instantaneous value of the reference voltage to oscillate between narrowly spaced limits; this is preferable to letting the voltage drift due to the leakage of the capacitor in the push-pull amplifier 9.

Figure 5:
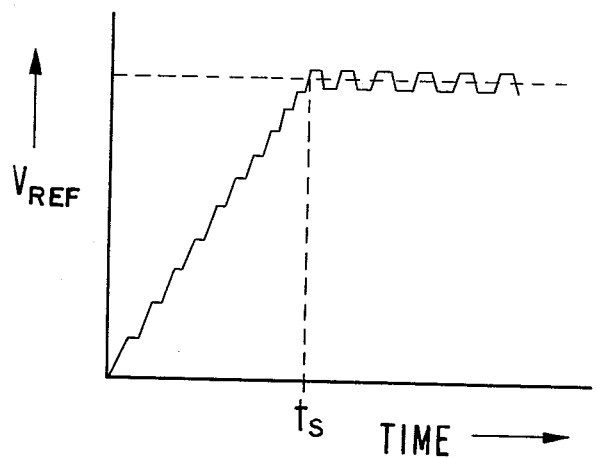
FIG. 5 is a graph of the instantaneous reference voltage generated by the reference voltage generator of the present invention.

The reference voltage generator described in FIG. 1 is exceptionally stable because the output of push-pull amplifier 9 and thus the voltage on input 11 will change more rapidly when the voltage associated with the incoming half charge is significantly lower than the voltage on terminal 11. As the respective voltages quickly come together, the incremental adjustment of the instantaneous value of the reference voltage by push-pull amplifier 9 will become less and less. This allows the reference voltage generator to quickly achieve a reference voltage which approximates a voltage associated with the incoming half-size charge packet which in turn tracks the voltage associated with a full charge packet in the data-processing portion of the charge-coupled device. The character of the reference voltage is shown in FIG. 5. Initially the reference voltage will be much lower than the voltage associated with the incoming charge. As each charge is received, the push-pull amplifier pushes the voltage incrementally higher until the instantaneous value for the reference voltage exceeds the voltage associated with the incoming charge. The time, $t_s$, for this to occur is called the set-up time which in effect is a "power-on" time.

Alternate schemes may be used to provide the reference voltage generator of FIG. 1 with one-half a full charge packet. In any scheme it is desirable to employ a dedicated string of conductor-insulator-semiconductor charge storage elements (CCD cells) fabricated on the same chip as the CCD so that the half charge packet has the same characteristics as charge packets in the data-processing portion of the device. One technique is to fabricate the charge storage elements in dedicated line 4 with a charge storage capacity equal to one-half the capacity of the CCD cells in the data-processing portion of the device. If the input to the dedicated CCD line and to the data-processing lines is identical, then approximately one-half a full charge will be available to the reference voltage generator. While this scheme is inherently simple and may require only a few dedicated charge storage elements, it is not necessarily simple to fabricate a charge storage element one-half the size of another element. Alternatively, a string of charge storage elements of equal width to those in the standard string in the data-processing portion of the device may be employed with a divider which splits the flow of charge into two channels before connection with comparison means 5. If the channels are evenly split, then the input to the comparison means will be approximately equal to one-half a full charge. This scheme requires a dedicated string of significant length but readily provides exactly a half charge with standard photofabrication techniques. In one preferred embodiment of this scheme the charge is divided at the beginning of the dedicated string and the remaining charge storage elements are of the same size as charge storage elements in the data-processing portion of the charge-coupled device so that dark current pickup tracks the dark current in the data-processing portion of the CCD. In other embodiments in which the reference voltage generator is to be used for random-access memories which have lines cycling at varying clock rates, the shift rate and length of the dedicated string of charge-coupled elements may be varied to produce the best compromise input to the comparison means. For example, the dedicated line of charge-coupled elements may be cycled at a rate which produces a full shift in one refresh cycle and the string of standard size charge-coupled elements is divided at the end to produce half a standard charge and half of the refresh interval dark current.

Figure 6A:
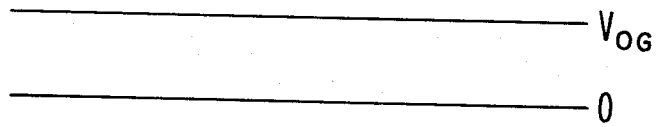
FIGS. 6A–6D are graphs illustrating the levels of $V_{OG}$, 0, 0 and $0_g$ as a function of time.
Figure 6B:
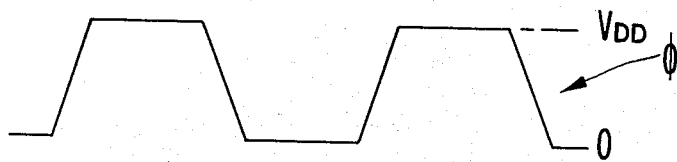
Figure 6C:
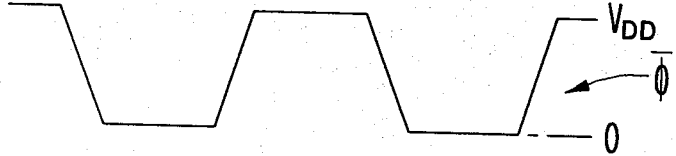
Figure 6D:
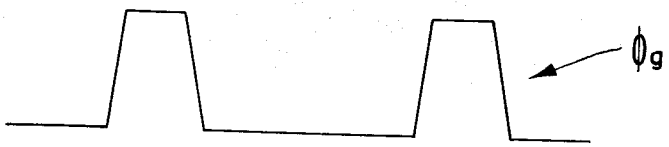

The operation of the reference voltage generator of the present invention may be seen by reference to the preferred embodiment of FIG. 2. An input charge equal to approximately one-half the magnitude of a full charge packet is introduced to the circuit through a series of dedicated CCD cells including clocked electrodes 10 and 11. It is important that the input charge be half the magnitude of a full charge as it would appear at the end of a standard length of CCD cells because this is the charge which will be compared by the comparison circuits (and subsequently refreshed) in the data-processing portion of the circuit. In order to delay transfer of charge to node 14 until FET 13 is turned off by clocking pulse $\overline{\phi}$ a barrier potential $V_{OG}$ is applied to gate electrode 12. The gate voltage level $V_{OG}$ is kept constant as shown in FIG. 6A. Node 14 goes through two states during a single cycle of operation — a ready state in which it can accept an incoming charge, and a signal state in which its potential reflects an already received incoming charge. In its ready state, node 14 will be at a potential of $V_{DD}$ since FET 13 will be on as clocking pulse $\overline{\phi}$ is high. When $\overline{\phi}$ goes low as shown in FIG. 6C, FET 13 turns off and at the same time any charge stored in the potential well underneath electrode 11 is poured over the potential level established by $V_{OG}$ and onto node 14. In a p-substrate system in which charge packets of electrons are transferred along a line of CCD cells, the arrival of charge on node 14 will reduce its potential in proportion to the size of the charge packet of electrons. After the comparison is performed by comparison means 80 and clocking pulse $\overline{\phi}$ again goes high, the voltage on node 14 will return to $V_{DD}$ as FET 13 turns on. The level of input node 14 thus controls FET 15 and constitutes one of the inputs to the comparison circuit 80. The other input to comparison circuit 80 is the gate voltage of FET 18 whose magnitude is the instantaneous value of the reference voltage provided by the feedback loop described subsequently.

The operation of the particular comparison circuit 80 shown in FIG. 2 is described in detail in copending U.S. application Ser. No. 448,771 by Gunsagar and Amelio. Any equivalent comparison circuit may be employed. Briefly, the conductance of FET 15 and 18 will be determined by the voltages on their respective gate electrodes. Since they are both indicated by cross-hatching to be enhancement-type transistors (the absence of cross-hatching indicates depletion-type transistors), they are nonconductive at zero voltage and become more conductive as their gate voltage increases. Thus, whichever one of FET's 15 or 18 has a higher gate voltage will be rendered more conductive. As shown, current may flow from node 17 to ground immediately after the gate pulse $\phi_g$ turns FET 16 on. Gate pulse $\phi_g$ effectively activates comparison circuit 80.

Prior to activation of comparison circuit 80, any charge previously stored on nodes 83 and 84 as the result of a previous comparison will have been discharged to ground through FET's 22 and 23 since $\phi$ has been high. Once comparison pulse $\phi_g$ goes high, the potential on nodes 83 and 84 will increase by an amount dependent upon the relative conductivity of FET's 15 and 18. Thus, the voltages on the gate electrodes of cross-coupled FET's 20 and 21 will increase differentially. When the threshold voltage of either FET 20 or 21 is reached, it will begin to conduct and the potential on the node connected to the drain of the switched-on FET will discharge to ground. Thus, the potential on the other node will relatively be significantly higher. The high and low levels after switch-on of one of the FET's constitute information as to the level of the incoming voltage as compared to the level of the instantaneous reference voltage.

The outputs from the comparison circuit 80 are used to drive the gate electrode of an FET in a buffer circuit 81 or 82. If the voltage associated with the input charge is greater than the reference voltage, then a high signal will appear on node 84 and will be sent to buffer circuit 82. If the voltage associated with the input charge is lower than the reference voltage, then a high signal will appear on node 83 and will be sent to buffer circuit 81. Circuits 81 and 82 are identical and serve essentially to provide a logic input to drive push-pull feedback amplifier 85 without placing a load on comparison circuit 80. The buffer circuits each contain a network of field-effect transistors which provide a stable output voltage in response to the logic signal from the comparison circuit. If a high signal appears on node 84, buffer circuit 82 is activated by transmission of the high signal to the gate electrode of FET 24. The source of FET 24 is connected to ground and to the source of FET 29. The drain of FET 24 is connected through node 25 to the source of FET 26 and to the gate of FET 29. Both the gate and drain of FET 26 are connected to the high circuit reference $V_{DD}$ which in turn is connected to the drain of FET 27. The gate electrode of FET 27 is connected to the comparison pulse $\phi_g$ so the buffer circuit can only provide an output while an active comparison is being carried out. The source of FET 27 is connected to the drain of FET 29 and serves as the output which is coupled with an input to push-pull feedback amplifier 85. In operation, when a high voltage is applied to the gate electrode of FET 24, it becomes conductive. Thus, the potential on node 25 which is normally at approximately $V_{DD}$ is lowered so that the potential on the gate electrode of FET 29 is lowered and FET 29 becomes nonconductive. Thus, since $\phi_g$ has recently gone high, FET 27 becomes highly conductive and the source reaches a voltage which is approximately at the potential of $V_{DD}$. This, a high potential is transmitted to the gate electrode of FET 30 of push-pull feedback amplifier 85. This constitutes the input which lasts until FET 22 discharges to ground and the high voltage on the gate of FET 24 is removed. On the other hand, if a high voltage is delivered to the gate electrode of FET 41 of buffer circuit 81, FET 41 is rendered conductive so that node 44 becomes less positive and FET 43 is turned off. Thus, since $\phi_g$ has recently gone high, FET 42 is rendered conductive and node 45 reaches a potential which is approximately $V_{DD}$ and a high voltage is delivered to the gate electrode of FET 37 of push-pull feedback amplifier 85.

Push-pull feedback amplifier 85 employs conventional push-pull amplification circuitry to incrementally adjust the instantaneous value of the reference voltage. The instantaneous reference voltage serves as an input to comparison circuit 80 and once it sets up may be externally accessed for use in comparison circuits. A voltage $V_s$, used for source-regulated "turn-around cells" (see copending U.S. application Ser. No. 458,733 of G. F. Amelio), is also available for use in the data-processing portion of the device. FET 30, as a depletion-mode device, will be conductive when no voltage is presented to its gate by buffer circuit 82. FET 37, as an enhancement-mode device, will be conductive only when a positive voltage is presented to its gate by buffer circuit 81. Thus, when the voltage associated with the input charge is greater than the instantaneous reference voltage, a high voltage appears on node 84 and a high voltage is received from buffer circuit 82. FET 30 is rendered more conductive and FET 37 remains nonconductive. A small increment of charge flows through FET 30 and nodes 38 and 36 to slightly increase the charge on capacitor 35. This increased charge slightly increases the voltage $V_s$ and the voltage $V_{REF}$ as the voltage determined by FET's 32 and 34 becomes higher. Since FET 32 is small compared to FET 34, the voltage on node 33 ($V_{REF}$) effectively follows the voltage on node 36 ($V_s$) and differs therefrom by a small fixed increment such as a threshold voltage. The new raised instantaneous value for $V_{REF}$ is transmitted to the comparison circuit 80 through FET 19 when clocking pulse $\overline{\phi}$ goes high during the next cycle. A filter capacitor 39 is provided on the $V_{REF}$ line to eliminate any problem due to noise or other transients. The above process will be repeated and the charge on capacitor 35 will be increased so long as the voltage associated with the incoming charge is greater than the instantaneous reference voltage. As soon as the voltage associated with the incoming input charge is less than the instantaneous reference voltage, a high voltage will appear on node 83 and a high voltage will be transmitted from buffer 81 to the gate of FET 37. FET 37 will be rendered conductive so that a current will flow from $V_{DD}$ to ground through FET's 30 and 37. A small increment of charge is also discharged from storage capacitor 35 to ground through node 36, node 38 and FET 37. Thus, the potential of node 36 ($V_s$) is lowered slightly and node 33 ($V_{REF}$) follows. The instantaneous voltage transmitted to comparison circuit 80 through FET 19 will be lower than it was on the previous cycle. As discussed above, once $V_{REF}$ sets up, it will effectively be a direct current with a slight ripple on the end. The width of the ripple is determined by the size of capacitor 35, the width of the $\phi_g$ on time and the transconductance of devices 30 and 37.

Another embodiment of the reference voltage generator of the present invention is shown in FIG. 3. A charge having a magnitude equal to one-half the magnitude of a full charge packet at the end of a standard length of CCD cells is presented to terminal 46. As described above with respect to FIG. 2, the bias on the gate electrode of FET 51 is periodically set when FET 47 turns on. Receipt of a quantity of charge at terminal 46 will lower the potential on the gate electrode of FET 51. The relative conductance of FET's 51 and 49 determines the rate at which nodes 74 and 75 become charged as current flows through FET 48 and thus determines which of cross-coupled FET's 53 and 54 turns on first. If a voltage associated with the incoming charge is greater than the reference voltage, a high voltage will be presented via node 74 to the gate of FET 59. If the voltage associated with the incoming charge is less than the reference voltage, then a high voltage will be presented via node 75 to the gate of FET 69. FET's 55 and 56 serve to reset nodes 74 and 75 at the end of each cycle. As discussed with respect to buffer circuit 82 of FIG. 2, if a high voltage is presented to the gate electrode of FET 59, a current passes through FET's 60 and 59 to ground. FET 58 then becomes nonconductive and the source of FET 57 reaches a voltage approximately at the potential of $V_{DD}$ so that a high potential is transmitted to the gate electrode of FET 63. A small increment of current then passes through FET 63 and raises the potential on capacitor 77 (FET 67 is off at this point). This raises the instantaneous reference voltage which is communicated through FET 50 to the gate of FET 49 and which is externally accessible. On the other hand, if a high voltage is presented to the gate electrode of FET 69, FET 69 is rendered conductive so that node 76 becomes less positive and FET 68 is turned off. Thus, when $\overline{\phi}$ goes high, and both FET's 65 and 64 are rendered conductive, the gate electrode of FET 67 goes high and a small increment of current passes to ground through FET's 64 and 67. This current also draws an incremental charge from capacitor 77. This lowers the instantaneous reference voltage.

Figure 4:
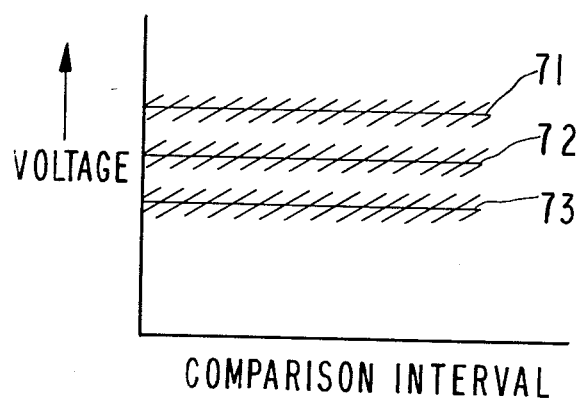
FIG. 4 is a pictorial diagram of a range of reference voltages lying in between the two ranges of voltages associated with an input charge to be detected in a digital comparison circuit.

The utility of the dynamic reference voltage generator of the present invention can be understood by reference to FIG. 4. In any comparison circuit employing a flip-flop arrangement, as described above, it is necessary to compare the incoming signal with a reference voltage. Lines 71 and 73 represent the expected values, respectively, for a voltage representing one state or one number in an n-dimensional system and the voltage representing another state or number in the n-dimensional system. In a digital system the two voltages would represent, respectively, a digital "1" and a digital "0"; in a tertiary system the two voltages would represent two of the three states in the system, and so on. The shaded areas on either side of the heavy lines 71 and 73 signify the possible values for the respective voltages. Line 72 represents the predicted suitable reference voltage while the shaded area represents the possible values for the reference voltage. The actual value of any of these voltages may vary as a result of design imperfections, variations in masks or variations in fabrication techniques. For a functioning device, none of the shaded areas can be allowed to overlap since a comparison circuit could not function if, for example, the signals representing both states or numbers fell on the same side of the reference voltage. The dynamic reference voltage generator of the present invention eliminates the range of values about heavy line 72 by automatically placing line 72 between the actual values for lines 71 and 73. Thus, the lines 71 and 73 can be designed to be closer together so that smaller size components can be used.

What is claimed is:

1. A reference voltage generator for use in combination with a charge-coupled memory device of the type having a plurality of charge storage elements connected in a standard data string and a differential sense amplifier means for detecting the amount of charge in a selected charge storage element comprising:

means for generating a charge whose magnitude lies approximately midway between a first charge representing one selected binary logic state and a second charge representing the other binary logic state in said charge-coupled memory device;

comparison means electrically coupled to both said means for generating a charge and an instantaneous reference voltage signal for detecting the relative magnitude therebetween and generating selectively an incremental correction voltage signal on a selected one of two outputs; and, feedback voltage generation means electrically coupled to said outputs on said comparison means for generating and incrementally adjusting said instantaneous reference voltage signal in response to said incremental correction voltage signal, whereby the instantaneous reference voltage lies approximately midway between the voltages associated respectively with the stored charges representative of the two binary logic states in the charge-coupled memory device.

2. A reference voltage generator in accordance with claim 1 wherein said means for generating a charge comprises a dedicated string of conductor-insulator-semiconductor charge storage elements of approximately equal length to a standard data string of charge storage elements in said chargecoupled memory device.

3. A reference voltage generator in accordance with claim 2 wherein the first charge storage element in said dedicated string has a charge storage capacity approximately one-half the capacity of the charge storage elements in standard data string.

4. A reference voltage generator in accordance with claim 2 wherein all charge storage elements in said dedicated string have charge storage capacities approximately one-half the capacity of charge storage elements in a standard data string.

5. A reference voltage generator in accordance with claim 2 wherein said charge storage elements in said dedicated string have charge storage capacities equal to the capacities of the charge storage elements in a standard data string.

6. A reference voltage generator in accordance with claim 2 wherein the first charge storage element in said dedicated string has a charge storage capacity one-half the capacity of the charge storage elements in a standard data string and the remaining elements in said dedicated string have charge storage capacities equal to the charge storage capacities of the charge storage elements in a standard data string.

7. A reference voltage generator in accordance with claim 1 wherein said feedback voltage generation means comprises a pair of buffer circuits whose inputs are connected respectively to said outputs of said comparison means, a push-pull amplifier whose inputs are connected respectively to the outputs of said pair of buffer circuits to incrementally adjust said instantaneous reference voltage, and a capacitive means electrically coupled with said push-pull amplifier and said comparison means to store a just previous value of said instantaneous reference voltage.

8. A reference voltage generator in accordance with claim 1 wherein said comparison means is as nearly identical as possible to the sense amplifier means for detecting the amount of charge in a selected charge storage element.

9. A reference voltage generator in accordance with claim 1 wherein said comparison means includes a pair of transistor devices in cross-coupled flip-flop configuration for comparing the voltage associated with said means for generating a charge with said instantaneous reference voltage signal to detect the relative magnitudes therebetween and provide said incremental correction voltage signal.

* * * * *